United States Patent [19]

Lee et al.

[11] Patent Number: 4,676,869
[45] Date of Patent: Jun. 30, 1987

[54] INTEGRATED CIRCUITS HAVING STEPPED DIELECTRIC REGIONS

[75] Inventors: Kuo-hua Lee; Samuel E. Polanco, both of Lower Macungie Township, Lehigh County, Pa.

[73] Assignee: American Telephone and Telegraph Company AT&T Bell Laboratories, Murray Hill, N.J.

[21] Appl. No.: 903,920

[22] Filed: Sep. 4, 1986

[51] Int. Cl.$^4$ .................. B44C 1/22; C03C 15/00; C03C 25/06
[52] U.S. Cl. .......................... 156/643; 156/646; 156/651; 156/653; 156/657; 156/659.1; 430/317
[58] Field of Search ............... 156/643, 646, 651, 653, 156/657, 659.1, 661.1, 662; 204/192 EC, 192 E; 427/38, 39; 430/313, 317

[56] References Cited

U.S. PATENT DOCUMENTS 3,880,684 4/1975 Abe .
4,181,564 1/1980 Fogarty et al. .
4,372,034 2/1983 Bohr .
4,461,672 7/1984 Musser .
4,484,978 11/1984 Keyser .............. 156/651 X
4,484,979 11/1984 Stocker .
4,505,026 3/1985 Bohr et al. .
4,543,707 10/1985 Ito et al. .
4,631,248 12/1986 Pasch ................. 430/313

OTHER PUBLICATIONS

Bilayer Taper Etching of Field Oxides and Passivation Layers, Lawrence Keith White, Electrostriction, vol. 127, No. 12, pp. 2687-2693.

Primary Examiner—William A. Powell
Attorney, Agent, or Firm—James H. Fox

[57] ABSTRACT

Deposited silicon dioxide may be used as a field oxide layer or for other dielectric purposes in integrated circuits. However, etching a pattern in the layer usually produces steep sidewalls that prevent good step coverage of subsequently deposited conductor layers. The present technique forms the dielectric in at least two layers having different densities. A sequence of anisotropic and isotropic etching results in stepped sidewalls, providing good linewidth control and good step coverage of subsequently deposited material.

15 Claims, 3 Drawing Figures

INTEGRATED CIRCUITS HAVING STEPPED DIELECTRIC REGIONS

BACKGROUND OF THE INVENTION

1. Field of the Invention

The present invention concerns an integrated circuit having a patterned dielectric region that provides good step coverage for subsequently deposited layers.

2. Description of the Prior Art

The use of "field oxides" is a standard technique in integrated circuit design. The field oxide is a patterned region of silicon dioxide that separates various regions of an integrated circuit, to prevent interaction therebetween. One standard technique for forming tthe field oxide is to initially deposit silicon nitride on a silicon semiconductor body, form a lithographic pattern of photoresist on the nitride, and then etch away the regions of the nitride that are unprotected by the photoresist. Then, the silicon regions exposed by the nitride removal are oxidized by exposure to either dry oxygen or steam at an elevated temperature. These grown oxide regions then serve as the field oxide regions. However, this leads to the well-known "birds beak" effect, wherein the grown oxide extends partially under the overlying nitride layer, due to diffusion of oxygen laterally into the silicon body as the oxide is grown. The birds beak effect undesirably increases the area occupied by the isolation region. This is particularly significant as lithographic dimensions decrease, and the relative area occupied by the birds beak increases.

Another known field oxide isolation technique is to deposit silicon dioxide on the semiconductor body, rather than to grow it. The deposited oxide is then directly patterned by photoresist and etched, leaving the desired isolation regions. However, this has the well-known disadvantage of producing steep sidewalls at the edges of the isolation regions. The steep sidewalls are difficult to cover satisfactorily with subsequently deposited layers. This is particularly troublesome with conductive layers that need to provide continuous coverage over the sidewalls, in order to provide electrical connectivity between elements of the integrated circuit. Various techniques have been proposed to smooth the sidewalls. These include techniques for tapering the edge of the sidewall, or to round off the top corner. A review of these techniques is given in "Bilayer Taper Etching of Field Oxides and Passivation Layers", L. K. White, *Journal of the Electrochemical Society, vol.* 127 L page 268 (1980). A technique proposed in that article is to use a "taper control" layer on top of an oxide layer being isotropically etched in a buffered HF solution. However, the various techniques tend to have problems with reproducibility in many cases. In addition, many of the prior art techniques tend to cause an undesirable increase in the width of the etched region, reducing the number of features that may be placed in a given area.

The use of tapered edges is not limited to field oxide isolation regions. For example, tapered sidewalls of contact windows are produced by a variety of techniques, typically by flowing a doped glass at an elevated temperature.

SUMMARY OF THE INVENTION

We have intended a technique wherein a first dielectric layer having a relatively higher density is formed on a surface of a semiconductor device precursor. A second dielectric layer having a relatively lower density is formed on the first layer. A resist layer is deposited and lithographically patterned. An anisotropic etch transfers the resist pattern through the second layer and into the first layer. The resist is removed, and isotropic etch then causes the second layer to be laterally etched at a higher rate than the first layer, producing a stepped sidewall. Additional layers of differing densities may be utilized for additional steps if desired.

DETAILED DESCRIPTION

Figure 1:
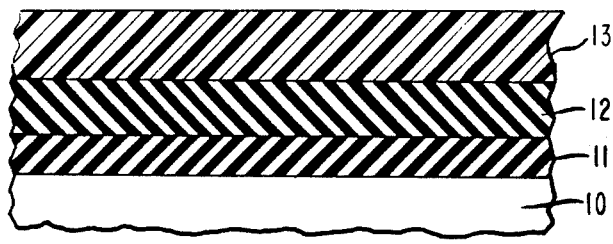
FIGS. 1-3 illustrate the steps of the invention.

The following detailed description relates to an improved technique for forming dielectric layers that provide good step coverage for one or more layers subsequently deposited thereon. Referring to FIG. 1, a substrate (10) serves to support the subsequently formed layers. Substrate 10 is typically a silicon wafer or epitaxial semiconductor layer thereon, but may be another type of device precursor. There is formed overlying the substrate 10 a first dielectric layer 11, typically silicon dioxide, having a given density. This layer is also referred to as the "bottom" layer herein. For example, layer 11 may be a grown silicon dioxide layer, or a deposited silicon dioxide layer that is densified by heating. If formed by deposition, layer 11 may be deposited directly on a semiconductor substrate, or alternately on a layer ground on the substrate (e.g., thermally grown $SiO_2$). As used herein, a densified deposited layer on a grown layer is considered to be the "first" layer. A second dielectric layer 12 is formed so as to have a relatively lower density. Layer 12 is typically a deposited silicon dioxide layer that is not densified following deposition. Alternately, layer 12 may be densified at a temperature lower than that used to densify layer 11.

Figure 2:
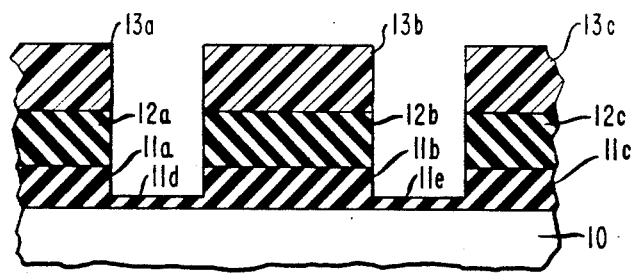

A resist layer 13 is utilized to form the desired lithographic pattern. Although a single resist layer is shown, a bilevel or trilevel resist may be used, according to principles known in the art. A pattern is formed in the resist layer by exposure to lithographic radiation, and the resist developed. Referring to FIG. 2, the developed pattern in resist layer 13 is transferred into the dielectric layer 12 and 11 by an anisotropic etching process, producing approximately vertical straight sidewalls as shown. This is typically accomplished by a dry process, such as reactive ion etching (RIE), according to known techniques. To prevent reactive ion etching into the substrate 10, a thin layer (11d, 11e) of the first dielectric may be left at the bottom of each etched region. The remaining patterned resist layer is then stripped off.

The dielectric layers are then subjected to an isotropic etching process. This process causes both lateral (horizontal as viewed in the FIGS.) and vertical (as viewed) etching of the second (top) dielectric layer 12, thereby, substantially reducing its thickness and also uncovering a portion of the top of layer 11. Because dielectric layer 11 has a higher density than layer 12, the isotropic etching produces relatively minor horizontal etching of layer 11. However, the top surface of layer 11 that is uncovered by the removal of layer 12 is etched by the isotropic etchant so as to form sloped surfaces 14 ... 17; see FIG. 3. The central portions of layer 11 (11a', 11b', 11c') typically remains covered by the remaining portions (12a', 12b', 12c') of layer 12. The isotropic etching also removes the portion of layer 11 remaining at the bottom of the etched regions (i.e., portions 11d and 11e). The resulting profile provides for good step coverage of subsequently deposited material over the dielectric regions. The subsequently deposited material is typically a conductor, typically doped polysilicon, but may alternately be a silicide or metal, or combination thereof.

The present technique will be more fully illustrated by means of the following Example:

EXAMPLE

An initial layer of silicon dioxide 100 nanometer (1000 angstrom) thick ("thinox") was grown by heating a silicon substrate to 1000 degrees C. in $O_2$ for 120 minutes. A layer of silicon dioxide was deposited on the thinox layer by chemical vapor deposition (CVD) from tetraethylorthosilicate (TEOS) in nitrogen carrier gas, according to a known technique. The deposition was conducted at a temperature of about 715 to 725 degrees C. for 40 minutes, producing a layer of silicon dioxide 400 nanometers (4000 angstroms) thick. This deposited silicon dioxide layer was densified by heating to 950 degree C. for 30 minutes in a dry oxygen ambient, resulting in a decrease in thickness to about 390 nanometers (3900 angstroms), a reduction of 2.5 percent. The combination of the grown thinox layer and this densified deposited layer is considered to be the "first layer" in this Example. A second layer of silicon dioxide 600 nanometers (6000 angstroms) thick was similarly deposited from TEOS onto the first layer. However, the second layer was not densified after deposition. A conventional photoresist was spin coated onto this second layer, patterned with optical radiation, and developed according to known techniques. The pattern of this developed photoresist was anisotropically transferred into the first and second oxide layers by reactive ion etching (RIE), producing patterns having a minimum linewidth of about 1.5 micrometers in the oxide layers. However, a portion of the first oxide layer about 50 nanometers (500 angstroms) thick was retained on the silicon wafer, by stopping the RIE process before reaching the substrate. This was accomplished by monitoring the thickness of the remaining oxide using laser interferometry. The photoresist was then stripped off the second silicon dioxide layer.

Figure 3:
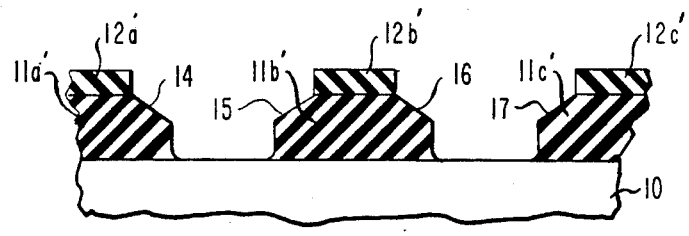

The wafer was then immersed in a 15:1 solution of water and hydrogen fluoride, which is a known isotropic etchant of silicon dioxide. This immersion was continued for 3 minutes, resulting in both lateral and vertical removal of about 450 nanometers (4500 angstroms) of material from the second (top) oxide layer. The first (bottom) oxide layer had only about 100 nanometers (1000 angstroms) of material laterally removed, due to its greater density as compared to the second layer. As the second layer was etched laterally, the top of the first layer was gradually exposed to the etchant. This lateral etching produced an edge of the top oxide layer that was recessed almost 300 nanometers from the edge of the bottom oxide layer. The remaining 50 nanometer (500 angstrom) portion of the first oxide layer was also removed by this isotropic etching, producing a structure as illustrated in FIG. 3. (The bottom portion of the edge of the first layer was tapered, due to the thinox portion of the first layer having a slightly greater density than the densified deposited portion). An optional process step then was used to grow a protective oxide layer in the exposed silicon regions by heating the wafer to 950 degrees C. in an $O_2$ ambient for 120 minutes. This grew a silicon dioxide layer 55 nanometer (550 angstroms) thick, and the elevated temperature during this operation also caused densification of the top oxide layer (12), substantially reducing its thickness to about 145 nanometers (1450 angstroms). The protective oxide was then cleaned off from the silicon substrate (in preparation for growing a gate oxide) by etching in a 15:1 HF solution for 3 minutes. This isotropic etching further rounded the corners of the first and second oxide layers.

Note that the present technique advantageously maintains a linewidth in the etched regions almost as small as the lithographic linewidth used to pattern the second (top) oxide layer. In addition, this etched linewidth is well defined, due to the ability of the anisotropic etching to accurately transfer the pattern through the second (top) oxide layer and into the first (bottom) oxide layer. This is in contrast to some of the prior art techniques, wherein the isotropic etching produced an undercut of the resist that depended on the resist/oxide interface properties, and hence linewidth control was limited by the ability to accurately and reproducibly control these properties. In contrast, the present technique results in a sidewall that is essentially vertical at the edges of the bottom layer (11a, 11b, 11c). In addition, the sloped top surface is formed also in the bottom layer, and is due to easily controlled density differences between the top and bottom oxide layers. While the foregoing has utilized silicon dioxide for the dielectric layers, the use of other dielectric materials is possible. It is also apparent that addition steps may be formed by the use of additional layers if desired. However, the exemplary two layer structure has been found suitable for providing good step coverage for subsequently deposited polysilicon.

The present technique may be used to produce sidewalls having good step coverage for a variety of purposes. In addition to field oxide isolation regions, contact window sidewalls may be formed by the present technique. Furthermore, the dielectric region between conductor layers (e.g., between two metal layers) may advantageously be formed by the present technique to provide good step coverage for the top conductor.

What is claimed is:

1. A method of making a solid state device Characterized by steps comprising:
    forming a first dielectric layer having a given density on a surface of a semiconductor device precursor;
    forming a second dielectric layer having a density less than said given density on said first layer;
    depositing a resist layer and lithographically defining a pattern in the resist;
    anisotropically etching said pattern through said second dielectric layer and into said first dielectric layer;
    removing said resist layer;
    and exposing the first and second dielectric layers to an isotropic etchant so that said second layer etches at a faster rate than said first layer, whereby a recessed edge of said second layer on said first layer is achieved.

2. The method of claim 1 wherein said step of anistotropically etching is terminated prior to etching completely through said first layer, thereby retaining a portion of said first layer at the bottom of the etched region, and wherein said step of isotropically etching removes the portion retained thereby.

3. The method of claim 1 wherein the thickness of said second layer as formed is greater than the thickness of said first layer as formed.

4. The method of claim 3 wherein the step of exposing said layers to an isotropic etchant reduces the thickness of said second layer to less than the thickness of said first layer.

5. The method of claim 1 wherein said first and second layers are silicon dioxide.

6. The method of claim 5 wherein said first layer is formed by deposition of silicon dioxide on said surface.

7. The method of claim 6 wherein said first layer is densified by heating to an elevated temperature so that its height is reduced at least one percent prior to said forming said second layer thereon.

8. The method of claim 1 wherein said surface comprises silicon, and said first layer comprises silicon dioxide that is grown on said surface.

9. The method of claim 1 wherein said anisotropically etching is accomplished by reactive ion etching.

10. The method of claim 1 wherein at least said second layer is silicon dioxide, and said isotropic etchant essentially comprises hydrogen fluoride.

11. The method of claim 1 wherein said dielectric layers comprise a field oxide isolation region of an integrated circuit.

12. The method of claim 1 wherein said first dielectric layer comprises a grown silicon dioxide layer and a densified deposited silicon dioxide layer.

13. The method of claim 1 further comprising the step of depositing a layer of conductive material on at least said second dielectric layer.

14. The method of claim 13 wherein said conductive material is doped polysilicon.

15. The method of claim 13 wherein said conductive material is a metal.

* * * * *